United States Patent [19]

Clecak et al.

[11] Patent Number: 4,601,969

[45] Date of Patent: Jul. 22, 1986

[54] HIGH CONTRAST, HIGH RESOLUTION DEEP ULTRAVIOLET LITHOGRAPHIC RESIST COMPOSITION WITH DIAZO CARBONYL COMPOUND HAVING ALPHA PHOSPHORYL SUBSTITUTION

[75] Inventors: Nicholas J. Clecak, San Jose, Calif.; Barbara D. Grant, Ossining, N.Y.; Robert D. Miller, San Jose, Calif.; Terry C. Tompkins, Los Altos, Calif.; Carlton G. Willson, San Jose, Calif.

[73] Assignee: International Business Machines Corporation, Armonk, N.Y.

[21] Appl. No.: 717,254

[22] Filed: Mar. 28, 1985

[51] Int. Cl.$^4$ ................................................. G03C 1/54
[52] U.S. Cl. .................................... 430/192; 430/141; 430/170; 430/189; 430/193; 430/270; 430/302; 430/326; 534/550; 534/558; 534/560; 534/561
[58] Field of Search ............... 430/192, 141, 170, 189, 430/193, 194, 270, 302, 325, 326; 534/556, 558, 560, 561

[56] References Cited

U.S. PATENT DOCUMENTS

| | | | |
|---|---|---|---|
| 3,567,453 | 3/1971 | Borden | 430/194 |
| 3,668,197 | 6/1972 | Firestone | 534/556 |
| 4,207,107 | 6/1980 | Ross | 430/193 |
| 4,339,522 | 7/1982 | Balanson et al. | 430/192 |
| 4,458,005 | 7/1984 | Mohr et al. | 430/302 |
| 4,522,911 | 6/1985 | Clecak et al. | 430/193 |

OTHER PUBLICATIONS

Regtiz et al., *Chem. Ber.*, 1969, vol. 102, pp. 2216–2229.
Wolter et al., *Chem. Ber.*, 1978, vol. 111, pp. 3068–3085.

*Primary Examiner*—Charles L. Bowers, Jr.
*Attorney, Agent, or Firm*—Joseph G. Walsh

[57] ABSTRACT

A lithographic resin for use with deep ultraviolet radiation comprises a weakly acidic resin and an alpha phosphoryl substituted diazo carbonyl compound as a sensitizer.

10 Claims, No Drawings

HIGH CONTRAST, HIGH RESOLUTION DEEP ULTRAVIOLET LITHOGRAPHIC RESIST COMPOSITION WITH DIAZO CARBONYL COMPOUND HAVING ALPHA PHOSPHORYL SUBSTITUTION

TECHNICAL FIELD

The present invention is concerned with lithographic resists for use with deep ultraviolet light i.e. light of wavelengths below 313 nm. In particular it deals with resists of this type which comprise an admixture of a weakly acidic resin and a specific type of sensitizer.

BACKGROUND ART

U.S. Pat. No. 4,339,522 describes the use of certain Meldrum's diazo compounds as sensitizers for deep ultraviolet when incorporated in resins.

Application Ser. No. 508,642, U.S. Pat. No. 4,522,911 assigned to the same assignee as the present application, discloses the use of diazohomotetramic acid compounds as deep ultraviolet sensitizers.

A resist system for use in lithography using deep ultraviolet light must simultaneously possess several characteristics. One, the system must have a sensitivity which allows it to be used at acceptable exposure and development times. Two, the system should have no spectral sensitivity in the longer wavelength regions, that is, above 300 nm. When there is no spectral sensitivity in that range, the need for inefficient spectral filtration of the radiation source is eliminated. Three, the formulated system should have an optical absorption consistent with the ability to generate photoresist images. Four, the system should have chemical and physical characteristics compatible with micro fabrication processes, such as resistance to reactive ion etching. Finally, the sensitizer should have photoproducts that are transparent at the irradiation frequency.

Because of the numerous demands which such a system must simultaneously meet, the prior art systems all leave something to be desired and fail to meet these stringent requirements completely.

DESCRIPTION OF THE INVENTION

According to the present invention lithographic resists for use with deep ultraviolet light comprise a weakly acidic resin and, admixed therewith, a sufficient quantity of a sensitizer which is an alpha phosphoryl substituted diazo carbonyl compound having the formula

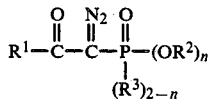

where each of $R^1$, $R^2$ and $R^3$ independently is alkyl or aryl, and n is 0, 1 or 2.

This class of sensitizer, when incorporated into weakly acidic resins, not only satisfies all the previously noted criteria, but also has the additional advantage of producing after exposure ketene intermediates which are photostable and remarkably unreactive toward the acidic host resin. This is a particular advantage of the present invention over the prior art. Prior art sensitizers yielded post irradiation ketenes which react to some extent with the resin to produce base insoluble derivatives which do not result in rapid dissolution of the exposed resist film in basic developers. The sensitizer of the present invention overcomes this difficulty.

For use in the present invention, the resist formulation includes a sensitizing amount of a compound of the type discussed above and a weakly acidic resin, many of which are well-known in the art. They include, for example, novolac resins such as cresol novolac, poly(p-hydroxystyrene) and copolymers of methacrylic acids with esters and imide containing copolymers. In general the sensitizer is preferably used at a concentration in the resin of from about 5 to 50% of the weight of the resin. The sensitizer is admixed with the resin and, upon image-wise exposure of the resin composition to deep ultraviolet radiation, the exposed portions of the composition becomes more soluble in alkaline developer.

When the expression "deep ultraviolet" is used it is meant to mean light of wavelength of less than 313 nm. Particularly, light of wavelength about 254 nm is useful in carrying out the present invention.

The phosphoryl substituted diazo carbonyl compounds useful in the present invention are known materials and their syntheses have been described in the literature. See, for example, M. Regtiz et al Chem. Ber. 1969, 102, 2216 and M. Regtiz et al, Chem. Ber. 1978, 111,3068. Examples of preferred compounds include (Diazophenacyl)-diphenyl phosphine oxides, (Diazo-p-tert-butylphenacyl)-diphenyl phosphine oxides, (Diazo-p-chlorophenacyl)-diphenyl phosphine oxides, (Diazo-p-methoxyphenacyl)-diphenyl phosphine oxides, (Diazo-p-phenylphenacyl)-diphenyl phosphine oxides and (Diazophenacyl)-dimethyl phosphonates.

EXAMPLE OF PREFERRED EMBODIMENT 1.87 grams of the sensitizer (Diazophenacetyl)-diphenylphosphine oxide was dissolved in 40 mL of a 25% wt/v solution of a novolac resin in diglyme. Films 1.1 um thick were prepared by spinning on 1-inch wafers of silicon at 4000 revolutions per minute. The wafers were then baked at 85° C. for 30 minutes and exposed in contact mode using a quartz mask (254 nm, 70 mj/cm²). The system was developed using an aqueous alkaline developer. The time to endpoint was approximately one minute. By this process high contrast vertical profile images were obtained.

We claim:

1. A lithographic resist composition for use with ultraviolet light of less than 313 nm wavelength, said composition comprising a sufficient quantity of a weakly acidic resin and admixed therewith a sufficient quantity of a sensitizer which is an alpha phosphoryl substituted diazo carbonyl compound having the formula

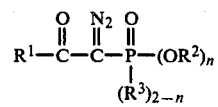

where each of $R^1$, $R^2$ and $R^3$ independently is alkyl or aryl, and n is 0, 1 or 2 the sufficient quantity amounts of the resin and the sensitizer enable ultra-violet exposed portions of the composition to become sufficiently soluble in an alkaline developer to permit formation of a resist image.

2. A composition as claimed in claim 1 wherein the sensitizer is a (Diazophenacyl)-diphenyl phosphine oxide.

3. A composition as claimed in claim 1 wherein the sensitizer is a (Diazo-p-tert-butylphenacyl)-diphenyl phosphine oxide.

4. A composition as claimed in claim 1 wherein the sensitizer is a (Diazo-p-methoxyphenacyl)-diphenyl phosphine oxide.

5. A composition as claimed in claim 1 wherein the sensitizer is a (Diazo-p-phenylphenacyl)-diphenyl phosphine oxide.

6. A composition as claimed in claim 1 wherein the sensitizer is a (Diazophenacyl)-dimethyl phosphonate.

7. A composition as claimed in claim 1 wherein the resin is a novolac resin.

8. A composition as claimed in claim 1 wherein the resin is p-cresol novolac.

9. A composition as claimed in claim 1 wherein the resin is poly(p-hydroxystyrene).

10. A composition as claimed in claim 1 wherein the resin is a copolymer of methacrylic acid with an ester thereof.

* * * * *